United States Patent [19]

Misawa

[11] Patent Number: 5,119,168

[45] Date of Patent: Jun. 2, 1992

[54] SEMICONDUCTOR INTEGRATED CIRCUIT

[75] Inventor: Hiroyuki Misawa, Tokyo, Japan

[73] Assignee: NEC Corporation, Tokyo, Japan

[21] Appl. No.: 413,459

[22] Filed: Sep. 27, 1989

[30] Foreign Application Priority Data

Sep. 28, 1988 [JP] Japan ................................ 63-245053

[51] Int. Cl.⁵ ...................... H01L 23/54; H01L 23/12
[52] U.S. Cl. ........................................ 357/68; 357/45; 357/71
[58] Field of Search ................ 357/45, 68, 71, 80, 357/75

[56] References Cited

U.S. PATENT DOCUMENTS 4,523,106  6/1985  Tanizawa et al. ................ 357/45
4,602,270  7/1986  Finegold et al. ................. 357/68

Primary Examiner—Rolf Hille
Assistant Examiner—S. V. Clark
Attorney, Agent, or Firm—Sughrue, Mion, Zinn, Macpeak & Seas

[57] ABSTRACT

A power supply wiring arrangement of a semiconductor integrated circuit formed on a semiconductor chip, including a plurality of pairs of metal bumps formed on the semiconductor chip, a plurality of conductor strips each extending between the bumps forming each of the pairs of metal bumps, and a plurality of thick-layer wiring strips directly connected to selected ones of the metal bumps and the conductor strips, the thick-layer wiring strips being substantially identical in material and in thickness to the metal bumps.

5 Claims, 6 Drawing Sheets

SEMICONDUCTOR INTEGRATED CIRCUIT

FIELD OF THE INVENTION

The present invention relates to a semiconductor integrated circuit and, more particularly, to a power supply wiring arrangement of a semiconductor integrated circuit typically implemented by an emitter-coupled logic gate array fabricated on a semiconductor chip forming a large-scale integrated circuit.

SUMMARY OF THE INVENTION

The present invention contemplates provision of an improved semiconductor integrated circuit eliminating the problems which would result from an increased integration density on a semiconductor large-scale integrated circuit chip. The present invention further contemplates provision of an improved semiconductor integrated circuit minimizing the irregularities in the levels of the supply voltages to the individual elementary cells of a semiconductor large scale integrated circuit chip. The present invention further contemplates provision of an improved semiconductor integrated circuit in the form of an emitter-coupled logic gate array minimizing the irregularities in the levels of the supply voltages to the individual elementary cells of the gate array and eliminating the problems which would result from an increased integration density on a semiconductor large-scale integrated circuit chip.

In accordance with a first aspect of the present invention, there is provided a power supply wiring arrangement of a semiconductor integrated circuit formed on a semiconductor chip, comprising a) a plurality of pairs of metal bumps formed on the semiconductor chip, b) a plurality of conductor strips each extending between the bumps forming each of the pairs of metal bumps, and c) a plurality of thick-layer wiring strips directly connected to selected ones of the metal bumps and the conductor strips, the thick-layer wiring strips being substantially identical in material and in thickness to the metal bumps.

In one preferred embodiment of the present invention, the thick-layer wiring strips extend along the conductor strips, respectively, and are directly connected to selected ones of the metal bumps. In another preferred embodiment of the present invention, the thick-layer wiring strips extend perpendicularly to the conductor strips and are arranged in groups each consisting of thick-layer wiring strips directly connected to one of the conductor strips.

In accordance with a second aspect of the present invention, there is provided a power supply wiring arrangement of a semiconductor integrated circuit formed on a semiconductor chip, comprising a) a plurality of pairs of metal bumps formed on the semiconductor chip, and b) a plurality of power supply lines each extending between the bumps forming each of the pairs of metal bumps, c) wherein the main power supply lines consist of thick-layer wiring strips substantially identical in material and in thickness to the metal bumps.

In accordance with a third aspect of the present invention, there is provided a power supply wiring arrangement of a semiconductor integrated circuit formed on a semiconductor chip, comprising a) a plurality of pairs of metal bumps formed on the semiconductor chip, b) a plurality of power supply lines each extending between the bumps forming each of the pairs of metal bumps, and c) a plurality of thick-layer wiring strips extending perpendicularly to the power supply lines and arranged in groups each consisting of thick-layer wiring strips directly connected to one of the power supply lines, the thick-layer wiring strips being substantially identical in material and in thickness to the metal bumps.

In accordance with a fourth aspect of the present invention, there is provided a semiconductor integrated circuit formed on a semiconductor chip, comprising a) a plurality of logic building blocks arranged in rows and columns on the semiconductor chip and each including a predetermined number of elementary cells arranged in row, b) a plurality of pairs of metal bumps formed on the semiconductor chip, c) a plurality of thick-layer wiring strips each electrically connected to selected ones of the elementary cells and to selected ones of the metal bumps, the thick-layer wiring strips being substantially identical in material and in thickness to the metal bumps, and d) a plurality of conductor strips each extending in crossing relationship to the rows of the logic building blocks between the bumps forming each of the pairs of metal bumps, e) the thick-layer wiring strips being directly connected to selected ones of the metal bumps and the conductor strips.

In accordance with a fifth aspect of the present invention, there is provided a semiconductor integrated circuit formed on a semiconductor chip, comprising a) a plurality of logic building blocks arranged in rows and columns on the semiconductor chip and each including a predetermined number of elementary cells arranged in row, b) a plurality of pairs of metal bumps formed on the semiconductor chip, c) a plurality of main power supply lines each extending in crossing relationship to the rows of the logic building blocks between the bumps forming each of the pairs of metal bumps, and d) local power distribution lines directly branched from the main power supply lines, each of the local power distribution lines extending along one of the logic building blocks and electrically connected to selected ones of the elementary cells of the particular one of the logic building blocks, e) wherein the main power supply lines and the local power distribution lines include thick-layer wiring strips substantially identical in material and in thickness to the metal bumps.

In accordance with a sixth aspect of the present invention, there is provided a semiconductor integrated circuit formed on a semiconductor chip, comprising a) a plurality of logic building blocks formed substantially in parallel with each other on the semiconductor chip and each including a plurality of elementary cells, b), a plurality of pairs of metal bumps formed on the semiconductor chip, c) external power supply leads of metal and respectively formed on the pairs of metal bumps, d) a plurality of thick-layer wiring strips each extending in crossing relationship to the logic building blocks between the bumps forming each of the pairs of metal bumps, the thick-layer wiring strips being substantially identical in material and in thickness to the metal bumps, e) main power conductor strips of metal respectively formed on the thick-layer wiring strips and extending between the external power supply leads on the bumps forming each of the pairs of metal bumps, and f) local power distribution lines electrically connected to the thick-layer wiring strips, each of the local power distribution lines extending along one of the logic building blocks and electrically connected to selected ones of the elementary cells of the particular one of the logic building blocks.

In accordance with a seventh aspect of the present invention, there is provided a semiconductor integrated circuit formed on a semiconductor chip, comprising a) a plurality of logic building blocks formed substantially in parallel with each other on the semiconductor chip and each including a plurality of elementary cells, b) a plurality of pairs of metal bumps formed on the semiconductor chip, c) main power supply conductor strips of metal each extending in crossing relationship to the logic building blocks between the bumps forming each of the pairs of metal bumps, and d) local power distribution lines electrically connected to the thick-layer wiring strips, each of the local power distribution lines extending along one of the logic building blocks and electrically connected to selected ones of the elementary cells of the particular one of the logic building blocks, each of the local power distribution lines being formed by a thick-layer wiring strip which is substantially identical in material and in thickness to the metal bumps.

BRIEF DESCRIPTION OF THE ACCOMPANYING DRAWINGS

The drawbacks of a prior-art semiconductor integrated circuit of the nature to which the present invention appertains and the features and advantages of a semiconductor integrated circuit according to the present invention over such a prior-art semiconductor integrated circuit will be more clearly understood from the following description taken in conjunction with the accompanying drawings in which like reference numerals and characters designate similar or corresponding structures, elements and portions and in which.

DETAILED DESCRIPTION OF THE RELATED ART

Figure 1:
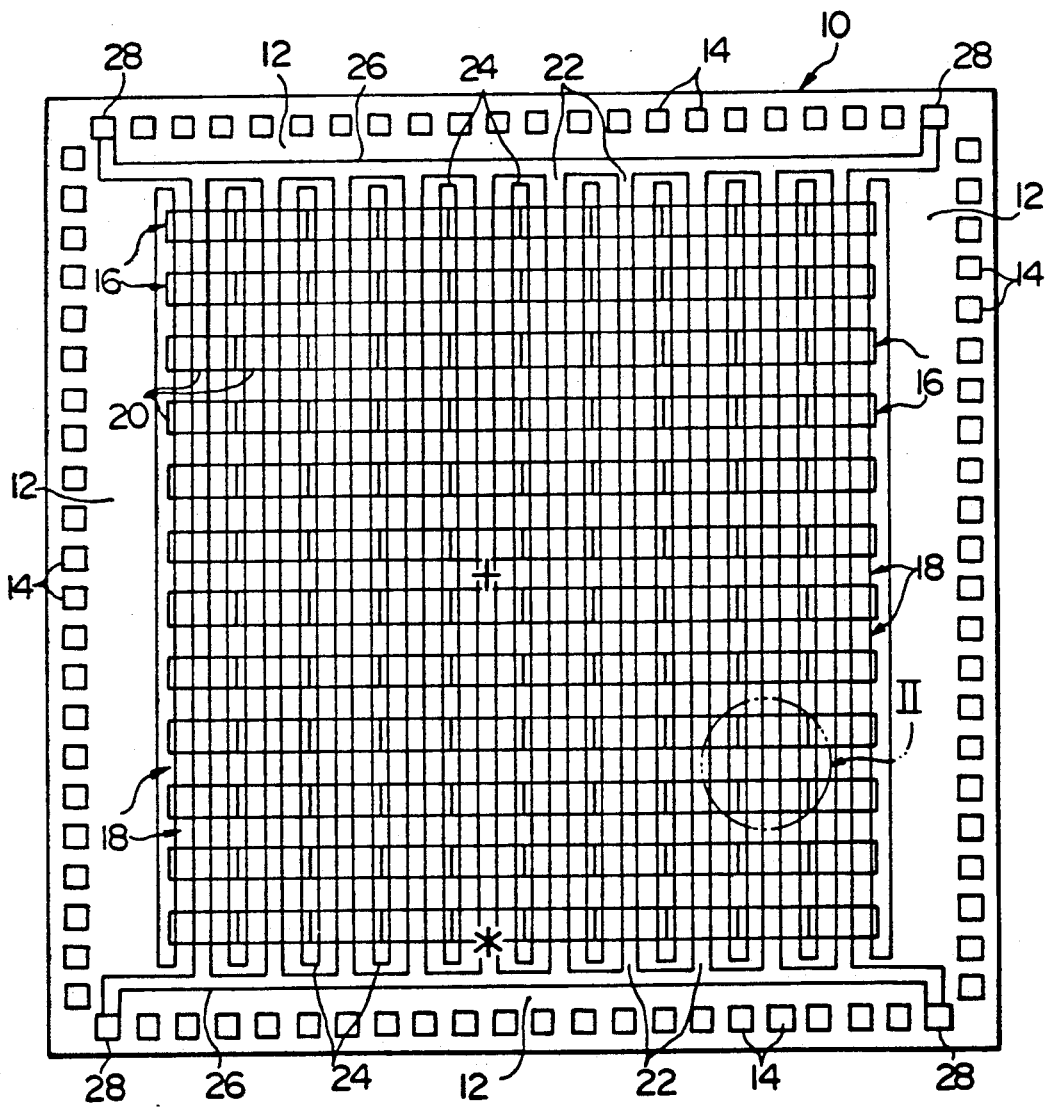
FIG. 1 is a plan view showing the general cell configuration and power-supply wiring arrangement of a prior-art emitter-coupled logic gate array.

Drawbacks of a prior-art semiconductor integrated circuit will be hereinafter described in more detail with reference to FIG. 1 which shows the general cell configuration and power-supply wiring arrangement of a known emitter-coupled logic gate array formed on a semiconductor large-scale integrated circuit chip 10.

The semiconductor integrated circuit thus formed on the large-scale integrated circuit chip 10 has peripheral bonding-pad areas 12 each having a series of wire bonding pads 14 arranged alongside the edge of the chip 10. On the circuit chip 10 are further provided a plurality of logic building blocks 16 arranged in parallel with each other to form wiring channels 18 therebetween and each composed of a series of elementary cells 20.

On the logic building blocks 16 and wiring channels 18 are formed high-level and low-level power supply conductor strips 22 and 24 each of which extends at right angles to the logic building blocks 16 and wiring channels 18. The high-level power supply conductor strips 22 extend in parallel with each other between a pair of common high-level power supply leads 26 extending along one pair of parallel bonding-pad areas and each leading from particular one or two of the wire bonding pads 12 arranged along the pair of bonding pad areas. The low-level power supply conductor strips 24 extend in parallel with these high-level power supply conductor strips 22 and are arranged alternately to the high-level power supply conductor strips 22 so that each of the elementary cells 20 has its center portion crossed by a portion of a high-level power supply conductor strip 22 as will be better seen in FIG. 2. FIG. 2 is a fragmentary plan view showing, to an enlarged scale, a portion of the prior art gate array shown enclosed by circle II in FIG. 1. Each of the low-level power supply conductor strips 24 is thus located at adjacent end portions of adjacent two of the elementary cells 20 of each logic building block 16 so that each elementary cell 20 has its opposite end portions respectively crossed by portions of adjacent two of the low-level power supply conductor strips 24 as will be also better seen in FIG. 2.

The elementary cells 20 forming the individual logic building blocks 16 are selectively connected together through interconnection lines extending underneath the elementary cells 20 and in the wiring channels 18, though not shown in the drawings. Interconnection lines selectively connecting the elementary cells 20 may also be formed in the top-level layer including the high-level power supply conductor strips 22.

In the prior-art emitter-coupled logic gate array thus formed on the large-scale integrated circuit chip 10, the logical swings between the high-level and low-level voltages used for the individual elementary cells 30 are significantly smaller than those used in logic gate arrays of other types. The absolute values of the logic levels used in the emitter-coupled logic array are thus determined on the basis of the high-level power supply voltage and, for this reason, the high-level power supply conductor strips 22 in particular must be fabricated with strict preciseness. The high-level power supply conductor strips 22 are thus laid out with a view to reducing the voltage drops through the conductor strips and are, for this purpose, formed to extend over the individual elementary cells 20. The high-level power supply conductor strips 22 included in the top level layer of the chip 10 can be formed with desired thicknesses and can be connected directly from the power-supply bonding pad or pads 12 to the individual elementary cells 20.

On the other hand, the low-level power supply conductor strips 24 need not be fabricated with the preciseness required for the fabrication of the high-level power supply conductor strips 22 and are laid out to extend in part over the elementary cells 20 and in part below the high-level power supply conductor strips 22. The conductor strips 24 are formed by an inter-level layer underlying the top-level layer including the high-level power supply conductor strips 22 where the low-level power supply conductor strips 24 cross the high-level power supply conductor strips 22. Where the low-level power supply conductor strips 24 cross the elementary cells 20, the conductor strips 24 are formed to extend over the elementary cells 20 to minimize the irregularities in the levels of the supply voltages to the individual elementary cells 20.

It is now assumed that the design rules of the chip 10 are such that each of the elementary cells 20 has a length (X) of 300 microns and a pitch (Y) of 200 microns and that each of the high-level and low-level power supply conductor strips 22 and 24 has a width (W) of 50 microns. It is further assumed that the top-level layer forming the high-level power supply conductor strips 22 is 3 microns thick and has a resistivity of 0.01 ohm/-square and that a current of 10 mA is to be applied to each of the elementary cells 20.

It is further assumed that there are ten elementary cells 20 located between the end point (indicated by sign "*" in FIG. 1) and the center point (indicated by sign "+" in FIG. 1) of the cell area of the chip 10. (Note that only six elementary cells 20 are shown for simplicity of illustration.) In this instance, the voltage drop in the length of high-level power supply conductor strip 22 extending over these ten elementary cells 20 is approximately 22 mV.

To achieve a reasonable noise margin and an acceptable high-speed performance efficiency in an emitter-coupled logic gate array, it is imperative that the voltage drop through a single high-level power supply line be limited within a range of this order, that is, approximately 22 mV.

Figure 2:
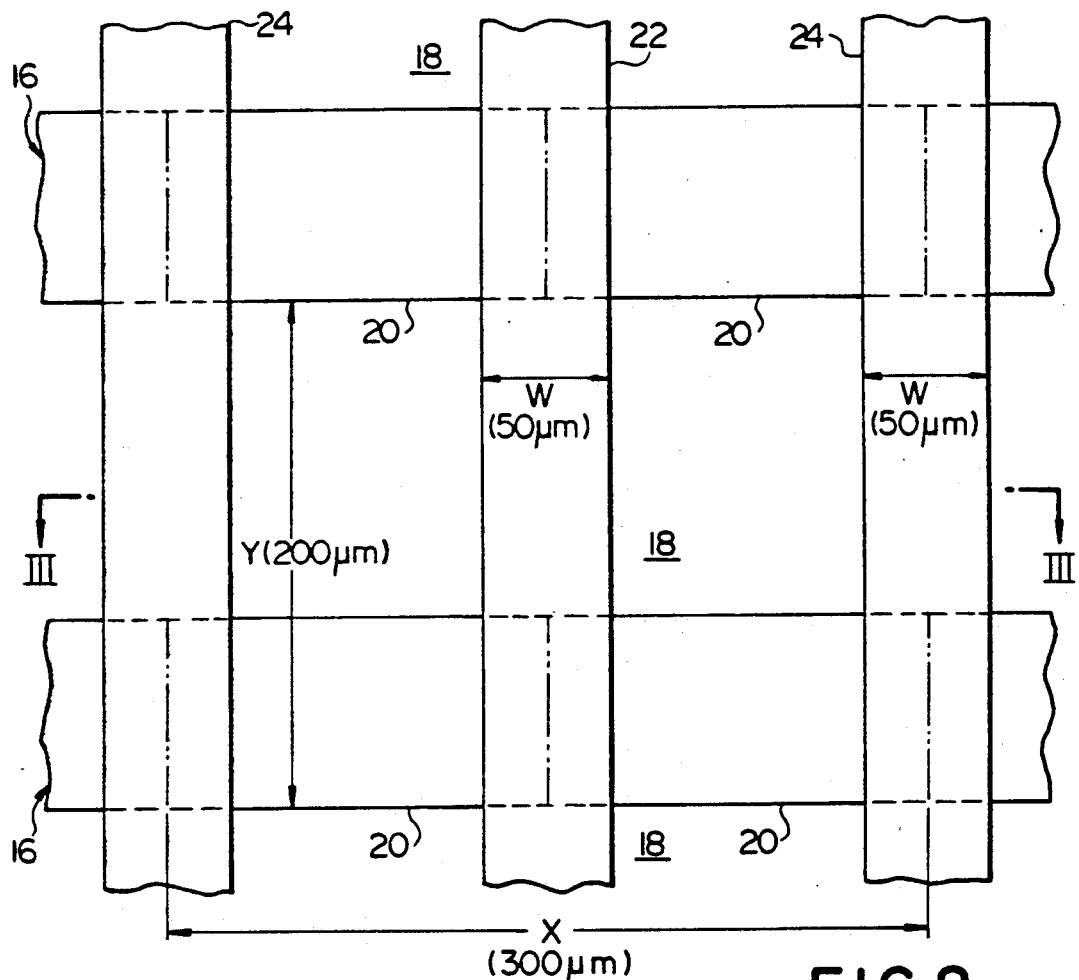
FIG. 2 is a fragmentary plan view showing, to an enlarged scale, a portion of the prior-art gate array shown enclosed by circle II in FIG. 1.
Figure 3:
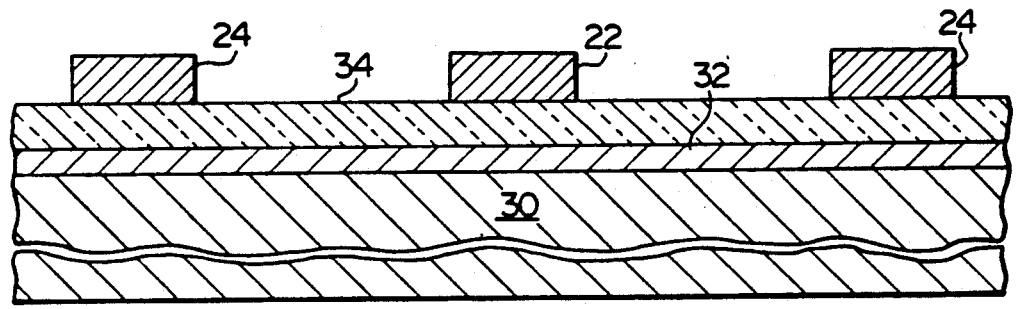
FIG. 3 is a sectional view taken along line III—III in FIG. 2.

FIG. 3 shows a cross sectional configuration of a portion of the large-scale integrated circuit chip 10 as taken along line III—III in FIG. 2. The prior-art large-scale integrated circuit chip 10 is shown including a semiconductor substrate 30, an inter-level conductor layer 32 forming interconnections for the elementary cells 20, and an insulator layer 34 of, typically, silicon dioxide underlying the toplevel layer including the high-level power supply conductor strips 22. The semiconductor substrate 30 is formed typically by a laminar structure consisting of a base layer of silicon and layers of insulator and diffusion selectively deposited thereon. The inter-level conductor layer 32 is formed by interconnection lines each having a width of, typically, 3 microns and is covered with the insulator layer 34. The insulator layer 34 underlies the toplevel layer forming the high-level power supply conductor strips 22 which extend transversely to the interconnection lines formed by the inter-level conductor layer 32.

It is now assumed that the insulator layer 34 of silicon dioxide has a relative permittivity of 4 and is 2 microns thick. Each of the high-level power supply conductor strips 22 measuring 50 microns in width as above noted, the parasitic capacitance $C_p$ between one of the interconnection lines forming the inter-level conductor layer 32 and one of the high-level power supply conductor strips 22 included in the top level layer crossing the interconnection line is given, when the layers 22 and 32 are regarded as the parallel plates of a capacitor, as:

$$C_p = (50\ \mu m \times 3\ \mu m)/2\ \mu m \times 4 \times \epsilon_o = 2.66 \times 10^{-3}\ pF \qquad \text{Eq. 1}$$

where $\epsilon_o$ stands for the permittivity of free space and is given as $\epsilon_o = 8.854 \times 10^{-6}\ pF/\mu m$.

Considering that a single elementary cell 20 is crossed by a single high-level power supply conductor strip 22 and a single low-level power supply conductor strip 24 (which consists of two half-width strip portions) each having a width W of 50 microns, the total parasitic capacitance CT between the inter-level conductor layer 32 formed by a unit length 1 mm (=1000 μm) of the interconnection line under consideration and the high-level power supply conductor strips 22 crossing the interconnection line is given as:

$$C_T = 1000\ \mu m/300\ \mu m \times 2 \times (2.66 \times 10^{-3}\ pF) \approx 0.018\ pF \qquad \text{Eq. 2}$$

The capacitance value of this order is of paramount importance in an emitter-coupled logic gate array and it is thus strongly desired that the value be reduced as much as possible.

In the meantime, there is a growing trend of the elementary cells of a logic gate array being scaled down and of the pitch distances of the elementary cells being reduced with a view to further improving the integration density of the array. In this connection, an imaginary large-scale integrated circuit chip may be taken into consideration in which the elementary cells in a logic gate array of the design described with reference to FIG. 1 is miniaturized by reducing the length X of each elementary cell to 150 microns and the pitch Y of each elementary cell to 100 microns. It may be herein assumed that, as a result of such improvement in the design rules of the logic array, the elementary cells which can be formed on a single chip is nine times larger in number than the elementary cells 22 provided in the logic gate array shown in FIG. 1. It may be thus be considered that the numbers of the rows and columns of the elementary cells are each three times larger than those of the elementary cells 20 in the shown prior-art array and accordingly that there are thirty elementary cells located between the end and the center points of the cell area of the chip. In this instance, the voltage drop V in the length of high-level power supply conductor strip extending over these thirty elementary cells is approximately 93 mV.

It is herein also assumed that the insulator layer 34 of silicon dioxide in such a circuit chip has a relative permittivity of 4 and is 2 microns thick and that each of the interconnection lines forming the inter-level conductor layer is 3 microns wide. If each of the high-level power supply conductor strips 22 is 50 microns wide, the parasitic capacitance between one of the interconnection lines forming the inter-level conductor layer 32 and one of the high-level power supply conductor strips 22 forming the toplevel layer crossing the interconnection line equal the capacitance $C_p$ given by Equation 1, hence $2.66 \times 10^{-3}$ pF.

Assuming further that a single elementary cell 20 is crossed by a single high-level power supply conductor strip and a single low-level power supply conductor strip 24 each having a width W of 50 microns, the total parasitic capacitance $C_T$ between the inter-level conductor layer 32 formed by a unit length 1 mm (=1000 μm) of the interconnection line under consideration and the high-level power supply conductor strips 22 crossing the interconnection line is given as:

$$C_T = 1000 \, \mu m / 150 \, \mu m \times 2 \times (2.66 \times 10^{-3} \, pF) \simeq 0.035 \, pF \qquad \text{Eq. 3}$$

From the above description it will be understood that notably increased ranges of voltage drops and inability of achieving desired noise margins result from the scaling down of emitter-coupled logic gate arrays of the prior-art design. The noise margin of an emitter-coupled logic gate array could be improved by the use of an increased logical swing between the high-level and low-level voltages for the individual elementary cells. This expedient will however prove unacceptable because of the fact that the use of the increased logical swing in a large-scale integrated circuit may result in irregularities in the levels of the supply voltages to the individual elementary cells and may give rise to an increase in the delay time in the operation of each of the elementary cells provided in the integrated circuit.

An increase in the delay time in the operation of an elementary cell may also be caused by the increase in the parasitic capacitance per unit length of an interconnection line. This problem implements another important factor to be taken into account in increasing the integration density of a large-scale integrated circuit chip while maintaining the potential performance characteristics of the circuit.

In the description regarding the imaginary large-scale integrated circuit chip, it has been assumed that the elementary cells in a prior-art logic gate array of the design described with reference to FIG. 1 is miniaturized by reducing the length X and pitch Y of each elementary cell with the width W of each of the high-level and low-level power supply conductor strips and maintained (at 50 microns). In the case of this arrangement of a large-scale integrated circuit, there is another problem that the toplevel layer including the high-level power supply conductor strips has lesser areas allowing interconnection lines to extend between the high-level power supply conductor strips 22. This is objectionable from the view point of providing an increased number of interconnection lines in a large-scale integrated circuit with an increased integration density.

The parasitic capacitance between the inter-level conductor layer forming interconnections and the insulator layer underlying the high-level power supply conductor strips could be reduced by otherwise increasing the thickness of the latter. Where each of the length and pitch of each of the elementary cells is reduced to one half as in the described imaginary large-scale integrated circuit chip, the increase in the voltage drop due to such measurement of each elementary cell could be offset by doubling the thickness of the insulator layer underlying the high-level power supply conductor strips. Various difficulties will however be encountered in forming such a thick insulator layer by the semiconductor process techniques presently available.

Accordingly, it is an important object of the present invention to provide an improved semiconductor integrated circuit eliminating the problems which would result from an increased integration density on a semiconductor large-scale integrated circuit chip.

It is another important object of the present invention to provide an improved semiconductor integrated circuit minimizing the irregularities in the levels of the supply voltages to the individual elementary cells of a semiconductor large-scale integrated circuit chip.

It is still another important object of the present invention to provide an improved semiconductor integrated circuit in the form of an emitter-coupled logic gate array minimizing the irregularities in the levels of the supply voltages to the individual elementary cells of the gate array and eliminating the problems which would result from an increased integration density on a semiconductor large-scale integrated circuit chip.

PREFERRED EMBODIMENTS OF THE INVENTION

Figure 4:
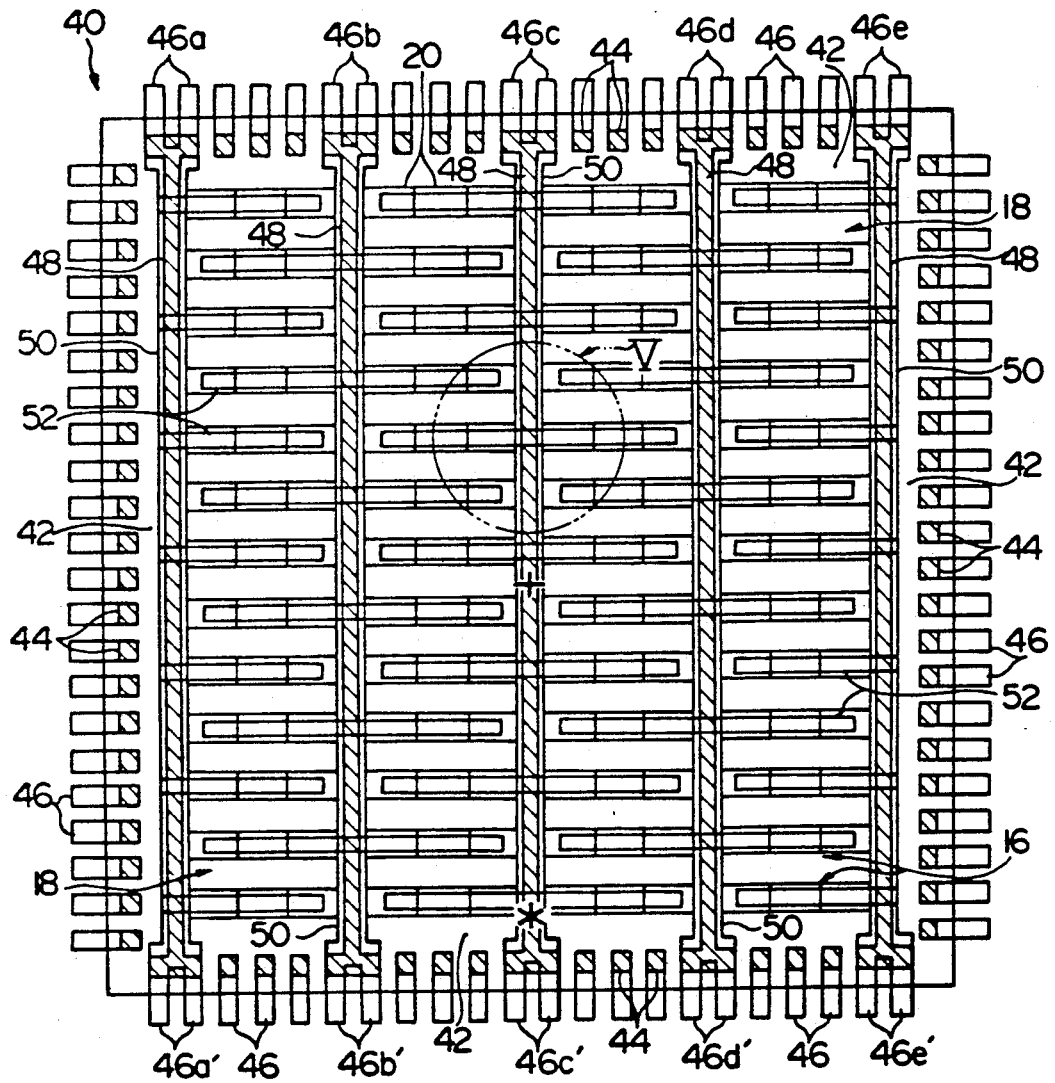
FIG. 4 is a plan view showing the general cell configuration and power-supply wiring arrangement of a first preferred embodiment of a semiconductor integrated circuit according to the present invention.

FIG. 4 shows the general cell configuration and power-supply wiring arrangement of a first preferred embodiment of an semiconductor integrated circuit according to the present invention. The semiconductor integrated circuit herein shown is provided in the form of an emitter-coupled logic gate array fabricated on a semiconductor large-scale integrated circuit chip which is now represented by reference numeral 40.

The large-scale integrated circuit chip 40 implementing the first preferred embodiment of the present invention is assumed to be electrically connected to external circuit components by a tape automated bonding or TAB process. Thus, the semiconductor chip 40 on which the semiconductor integrated circuit embodying the present invention is fabricated has bumped peripheral bonding pad areas 42 on each of which are mounted a series of metal bumps 44 arranged alongside each edge of the chip 40. The metal bumps 44, shown hatched in FIG. 4, are typically of gold, copper or solder and are formed on the chip 40 preferably during the semiconductor wafer processing operation to fabricate the emitter-coupled logic gate array on the chip 40.

In the tape automated bonding process is used a continuous lead carrier tape having leads in the form of a conductive frame of fingers etched on the surface of the tape, though not shown in the drawings. The leads thus formed on the continuous lead carrier tape are heated and forced against the individual bumps on a semiconductor chip by means of, typically, a thermocompression die or thermode to cause thermocompression bonds to the bumps on the chip. The lead carrier tape to be used in such a tape automated bonding process is fabricated separately of the semiconductor wafer processing steps, as well known in the art. Thus, the semiconductor large-scale integrated circuit chip 40 herein shown are connected to external circuit components through metal leads 46 each bonded at one end to one of the bumps 44.

On the semiconductor large-scale integrated circuit chip 40 shown in FIG. 4 are further provided a plurality of logic building blocks 16 arranged in parallel rows between one pair of parallel bonding-pad areas 42 of the chip 40 and spaced apart from each other to form parallel wiring channels 18 between the individual blocks 16. Each row of logic building blocks 16 consists of elementary cells 20 arranged in series between the other pair of parallel bonding-pad areas 42 as partly shown to an enlarged scale in FIG. 5 which shows a portion of the gate array enclosed by circle V in FIG. 4. The elementary cells 20, which may form logic inverters or logic AND, NAND, OR or NOR gate networks, are selectively connected together through interconnection lines extending underneath the elementary cells 20 and in the wiring channels 18, though not shown in the drawings.

In the semiconductor large-scale integrated circuit chip 40 implementing the first preferred embodiment of the present invention, the metal leads 46 leading outwardly from the chip 40 consist of a first set of metal leads used for the transmission of signals to and from the emitter-coupled logic gate array on the chip 40 and a second set of metal leads used as power supply terminals of the logic gate array on the chip 40. The first set of metal leads are herein referred to as signal input/output leads and the second set of external metal leads referred to as external power supply leads. The external power supply leads are shown consisting of those located adjacent one edge of the chip 40 as indicated by 46a, 46b, 46c, 46d and 46e and those located adjacent the opposite parallel edge of the chip 40 as indicated by 46a', 46b', 46c', 46d' and 46e'. The leads 46a, 46b, 46c, 46d and 46e located adjacent one edge of the chip 40 are respectively paired with the leads 46a', 46b', 46c', 46d' and 46e' located adjacent the opposite parallel edge of the chip 40. Thus, the logic gate array formed on the chip 40 herein shown has a plurality of pairs of external power supply leads 46a and 46a'; 46b and 46b'; 46c and 46c'; 46d and 46d' and 46e and 46e' as shown. The alternative pairs of leads 46a and 46a'; 46c and 46c' and 46e and 46e' are used as high-level power supply leads and the alternative pairs of leads 46b and 46b' and 46d and 46d' are used as low-level power supply leads.

The metal bumps 44 respectively underlying each of these pairs of power supply leads are connected together by elongated thick-layer wiring strips 48 which are also shown hatched in FIG. 4. The thick-layer wiring strips 48 extend perpendicularly to the individual logic building blocks 16 and are integral with the bumps 44 carrying the external power supply leads 46a to 46e and 46a' to 46e'. These thick-layer wiring strips 48 are preferably formed concurrently with the formation of the bumps 44 during the semiconductor wafer processing operation to fabricate the emitter-coupled logic gate array on the chip 40.

On the individual thick-layer wiring strips 48 in turn are formed internal power supply leads 50 which extend between the external power supply leads 46a to 46e located alongside one edge of the chip 40 and the external power supply leads 46a' to 46e' located alongside the opposite parallel edge of the chip 40. The internal power supply leads 50 thus connecting the pairs of external power supply leads 46a to 46e and 46a' to 46e' also extend perpendicularly to the logic building blocks 16 and are bonded to the thick-layer wiring strips 48 concurrently with the thermocompression bonding of the external metal leads 46 to the bumps 44 during the semiconductor wafer processing operation to fabricate the emitter-coupled logic gate array on the chip 40. The internal power supply leads 50 and the underlying thick-layer wiring strips 48 implement in combination main power supply lines 48/50 which cross the logic building blocks 16 in the emitter-coupled logic gate array fabricated on the semiconductor large-scale integrated circuit chip 40. The main power lines 48/50 extending between the external power supply leads 46a and 46a'; 46c and 46c'; and 46e and 46e' provide main high-level power supply lines and the main power lines 48/50 extending between the external power supply leads 46b and 46b'; and 46d and 46d' provide main low-level power supply lines in the large-scale integrated circuit chip 40.

Each of the logic building blocks 16 is composed of a row of three elementary cells 20 located between adjacent two of these main power supply lines 48/50. It may be herein noted that there are no elementary cells 20 located below the main power supply lines 48/50 so that the elementary cells 20 provided on the chip 40 are free from the mechanical stresses that will be created when the thick-layer wiring strips 48 are bonded to the chip 40 during tape automated bonding or TAB processing.

In the first preferred embodiment of the present invention, there are further provided local power distribution lines 52 branched perpendicularly from the main power supply lines 48/50. Each of these local power distribution lines 52 extends on and along one of the logic building blocks 16 and is electrically connected to selected ones of the elementary cells 20 of the logic building block 16 along which the local power distribution line 52 extends. Each of these local power distribution lines 52 may be implemented by a conductor strip branched from and integral with one of the thick-layer wiring strips 48. Alternatively, each of the local power distribution lines 52 may be implemented by a conductor strip branched from an inter-level conductor strip underlying and electrically connected to one of the thick-layer wiring strips 48. (As will be described with reference to FIG. 6, the inter-level conductor strip thus underlying and electrically connected to one of the thick-layer wiring strips 48 may be formed by the inter-level conductor layer 32 forming part of the laminar structure of the chip 40.)

The local power distribution lines 52 are thus electrically connected through the thick-layer wiring strips 48 and the internal power supply leads 50 to the pairs of external power supply leads 46a to 46e and 46a' to 46e'. In this instance, the local power distribution lines 52 connected through the leads 50 and thick-layer wiring strips 48 to the alternate pairs of external power supply leads 46a and 46a'; 46c and 46c' and 46e and 46e' are used as high-level power distribution lines and the local power distribution lines 52 connected through the leads 50 and thick-layer wiring strips 48 to the alternative pairs of leads 46b and 46b' and 46d and 46d' are used as low-level power distribution lines. The local power distribution line 52 which extends on each of the logic building blocks 16 is thus used either as the high-level power distribution line or as the low-level power distribution line. Between two adjacent main power supply lines 48/50 is provided a column of high-level and low-level power distribution lines 52 which extend alternately from the high-level and low-level main power supply lines 48/50. Thus, the high-level and low-level power distribution lines 52 appear alternately on the logic building blocks 16 extending between the main power supply line 48/50 intervening between the pair of high-level power supply leads 46a and 46a', 46c and 46c' or 46e and 46e' and the main power supply line 48/50 intervening between the pair of low-level power supply leads 46b and 46b' or 46d and 46d'. It may thus be noted that the low-level power distribution lines for the logic building blocks 16 having the overlying high-level power distribution lines 52 and the high-level power distribution lines for the logic building blocks 16 having the overlying low-level power distribution lines 52 lines are formed by another inter-level layer (not shown) underlying the inter-level layer forming the local power distribution lines 52 herein shown.

It may be further noted that the conductor strips forming the local power distribution lines 52 herein shown extend along and overlies the respectively associated ones of the logic building blocks 16 and are not located on the parallel wiring channels 18 between the individual logic building blocks 16. In the absence of the local power distribution lines 52 on the wiring channels 18, there are no parasitic capacitances added to the interconnection lines extending in the wiring channels 18.

Figure 5:
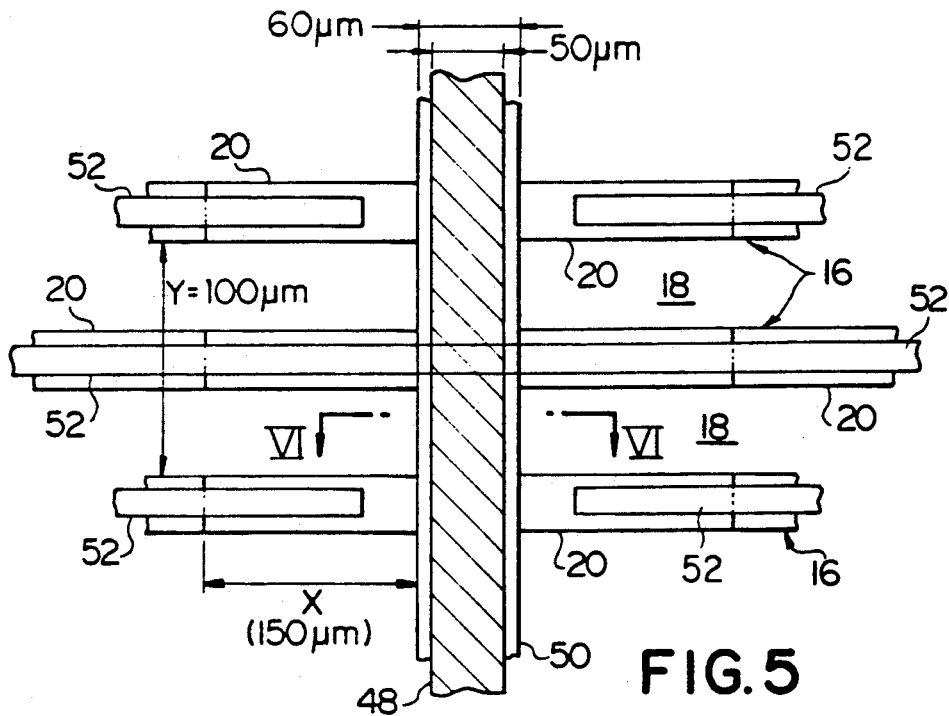
FIG. 5 is a fragmentary plan view showing, to an enlarged scale, a portion of the gate array shown enclosed by circle V in FIG. 4.
Figure 6:
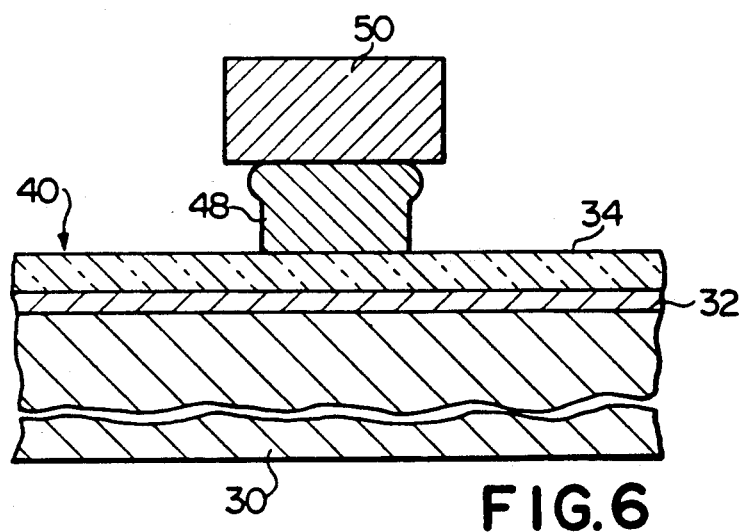
FIG. 6 is a sectional view taken along line VI—VI in FIG. 5.

FIG. 6 shows a cross sectional configuration of a portion of the large-scale integrated circuit chip 40 as taken along line VI—VI in FIG. 5. The large-scale integrated circuit chip 40 is shown comprising a semiconductor substrate 30, an inter-level conductor layer 32 forming interconnections for the elementary cells 20, and an insulator layer 34 of, typically, silicon dioxide. The thick-layer wiring strips 48 are formed on the insulator layer 34 and underlie the internal power supply leads 50. The semiconductor substrate 30 is formed typically by a laminar structure comprising a base layer of silicon and layers of insulator and diffusion selectively deposited thereon. In the first preferred embodiment of the present invention, furthermore, the inter-level conductor 32 of the large-scale integrated circuit chip 40 may further form the above mentioned inter-level conductor strips underlying and merging into the conductor strips implementing the local power distribution lines 52.

The interconnection lines formed by the inter-level conductor layer 32 are directed in crossing relationship to the main power supply lines formed by the thick-layer wiring strips 48 and internal power supply leads 50 and are assumed to measure 3 microns in width. The insulator layer 34 of silicon dioxide overlying this inter-level conductor layer 32 is formed to a thickness of 2 microns and is assumed to have a relative permittivity of 4. The thick-layer wiring strips 48 is formed by plating of gold onto this insulator layer 34. Each of the thick-layer wiring strips 48 is assumed to have a width of 50 microns and a resistivity of 0.001 ohm/square. Each of the internal power supply leads 50 overlying these thick-layer wiring strips 48 is assumed to have a width of 60 microns and a resistivity of 0.0005 ohm/square.

On the other hand, the metal bumps 44 are assumed to be formed to a thickness of 20 microns as is customary in the art of the tape automated bonding process and, thus, the thick-layer wiring strips 48 which are formed concurrently with the bumps 44 are also assumed to have a thickness of 20 microns. Likewise, the metal leads 46 thermocompression bonded on the metal bumps 44 are assumed to be formed to a thickness within a range of 50 to 60 microns as is also customary in the art of the tape automated bonding process. Thus, the internal power supply leads 50 which are formed concurrently with the metal leads 46 are assumed to have a thickness of 60 microns by way of example.

It is further assumed that the design rules of the chip 40 are such that each of the elementary cells 20 has a length X of 150 microns and a pitch Y of 100 microns. It is further assumed that there are a total of 60 rows of logic building blocks 16 on the semiconductor chip 40 although only 13 rows of logic building blocks are shown in FIG. 4 for simplicity of illustration and that a current of 10 mA is to be applied to each of the elementary cells 20.

Thus, each of the main power supply lines 48/50 such as for example, the high-level main power supply line 48/50 extending between the external leads 46c and 46c' is required to supply current to a total of ninety ($=3\times2\times60/4$) elementary cells 20 located between the end point (indicated by sign "*" in FIG. 4) and the center point (indicated by sign "+" in FIG. 4) of the cell area of the chip 40. In this instance, the voltage drop $-V$ in the length of main power supply line 48/50 extending over these ninety elementary cells 20 is approximately 10 mV.

Each of the thick-layer wiring strips 48 measuring 50 microns in width as above noted, the parasitic capacitance $C_p$ between one of the interconnection lines forming the inter-level conductor layer 32 and the high-level main power supply line 48/50 extending between the external leads 46c and 46c' and crossing the interconnection line is given, when the layer 32 and the layer forming the line 48/50 are regarded as the parallel plates of a capacitor, as:

$$C_p = (50 \ \mu m \times 3 \ \mu m \times 4 \times \epsilon_o = 2.66 \times 10^{-3} \ pF \qquad \text{Eq. 4}$$

As has been noted previously, $\epsilon_o$ stands for the permittivity of free space and is given as $\epsilon_o = 8.854 \times 10^{-6}$ pF/$\mu$m.

Considering that the internal lead 50 forming part of the power supply line 48/50 under consideration is associated with three elementary cells 20 each having the length (X) of 150 microns and per se has a width of 50 microns, the total parasitic capacitance $C_T$ between the inter-level conductor layer 32 formed by a unit length 1 mm ($=1000 \ \mu m$) of the interconnection line under consideration and the main power supply line 48/50 crossing the interconnection line is given as:

$$C_T = 1000 \ \mu m/(150 \ \mu m \times 3 + 60 \ \mu m) \times (2.66 \times 10^{-3} \ pF) \approx 0.005 \ pF \qquad \text{Eq. 5}$$

It will be understood that the capacitance value of the order given by this Eq. 5 approximately equals one seventh of the value of 0.035 pF given by Eq. 3 and is thus significantly smaller than the total parasitic capacitance in the described prior-art semiconductor integrated circuit. It may be noted that the interconnection line having the length of 1 mm average of $1000/(150\times3+60)$ sites.

Figure 7:
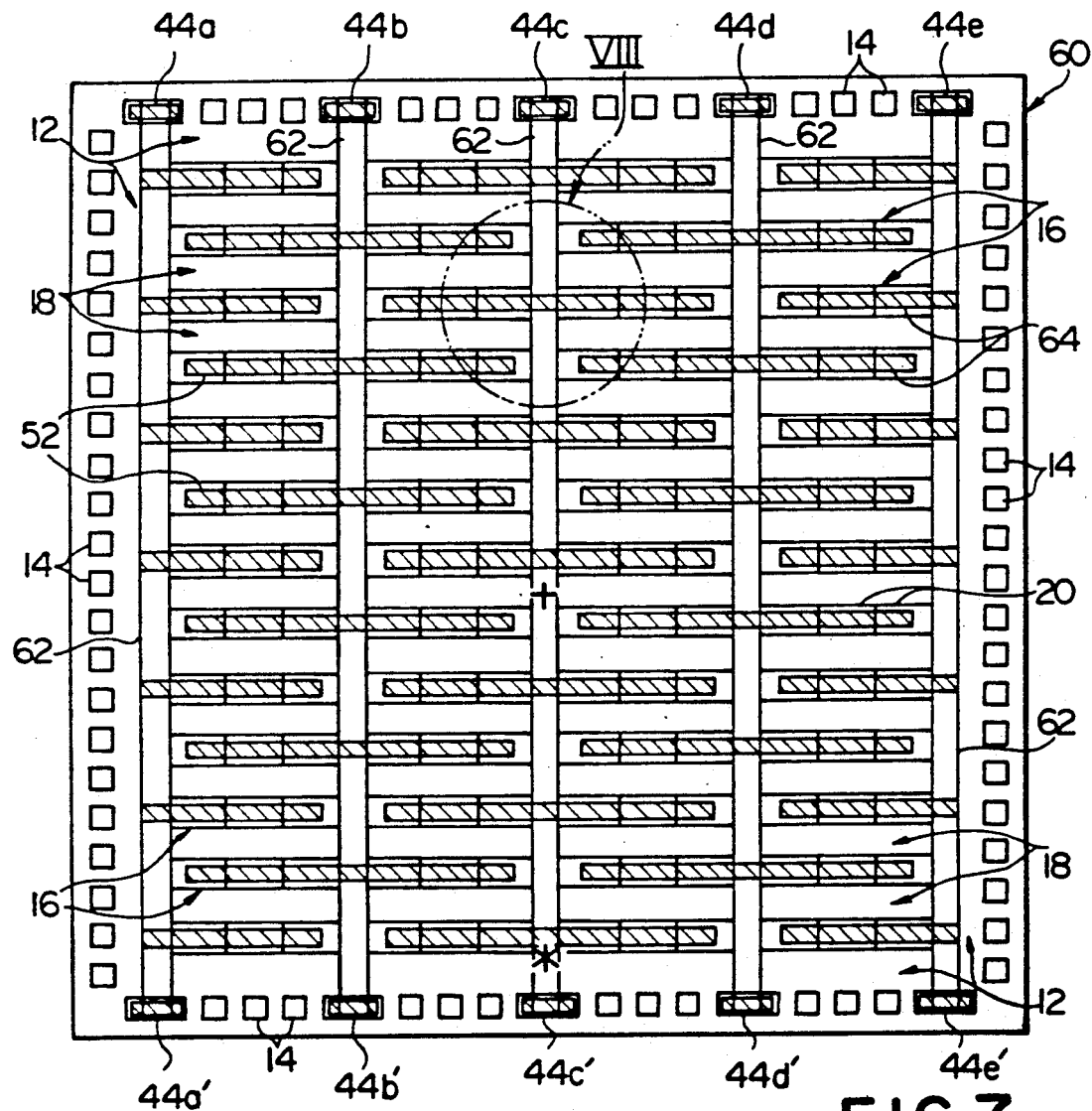
FIG. 7 is a plan view showing the general cell configuration and power-supply wiring arrangement of a second preferred embodiment of a semiconductor integrated circuit according to the present invention.

FIG. 7 shows the general cell configuration and power-supply wiring arrangement of a second preferred embodiment of a semiconductor integrated circuit according to the present invention. The semiconductor integrated circuit herein shown is also provided in the form of an emitter-coupled logic gate array fabricated on a semiconductor large-scale integrated circuit chip which is now represented by reference numeral 60.

The large-scale integrated circuit chip 60 implementing the second preferred embodiment of the present invention is assumed to be electrically connected to external circuit components by a wire bonding process. Thus, the semiconductor integrated circuit formed on the large-scale integrated circuit chip 60 has peripheral bonding-pad areas 12 each having a series of wire bonding pads 14 arranged alongside each edge of the chip 60. On selected ones of these wire bonding pads 14 are mounted a set of metal bumps 44a to 44e located alongside one edge of the chip 60 and a set of metal bumps 44a' to 44e' located the alongside the opposite parallel edge of the chip 60. Thus, the emitter-coupled logic gate array formed on the chip 60 herein shown has a plurality of pairs of metal bumps 44a and 44a'; 44b and 44b'; 44c and 44c'; 44d and 44d' and 44e and 44e' as shown. The alternative pairs of leads 44a and 44a'; 44c and 44c' and 44e and 44e' are used as high-level power supply terminals for the emitter-coupled logic gate array and the alternative pairs of leads 44b and 44b' and 44d and 44d' are used as low-level power supply terminals for the gate array. The metal bumps 44a to 44e and 44a' to 44e', shown hatched in FIG. 7, are typically of gold, copper or solder and are formed on the chip 60 preferably during the semiconductor wafer processing operation to fabricate the emitter-coupled logic gate array on the chip 60. The metal bumps 44a to 44e and 44a' to 44e' are formed on the selected ones of the bonding pads 14 typically by a thermocompression bonding process.

Figure 8:
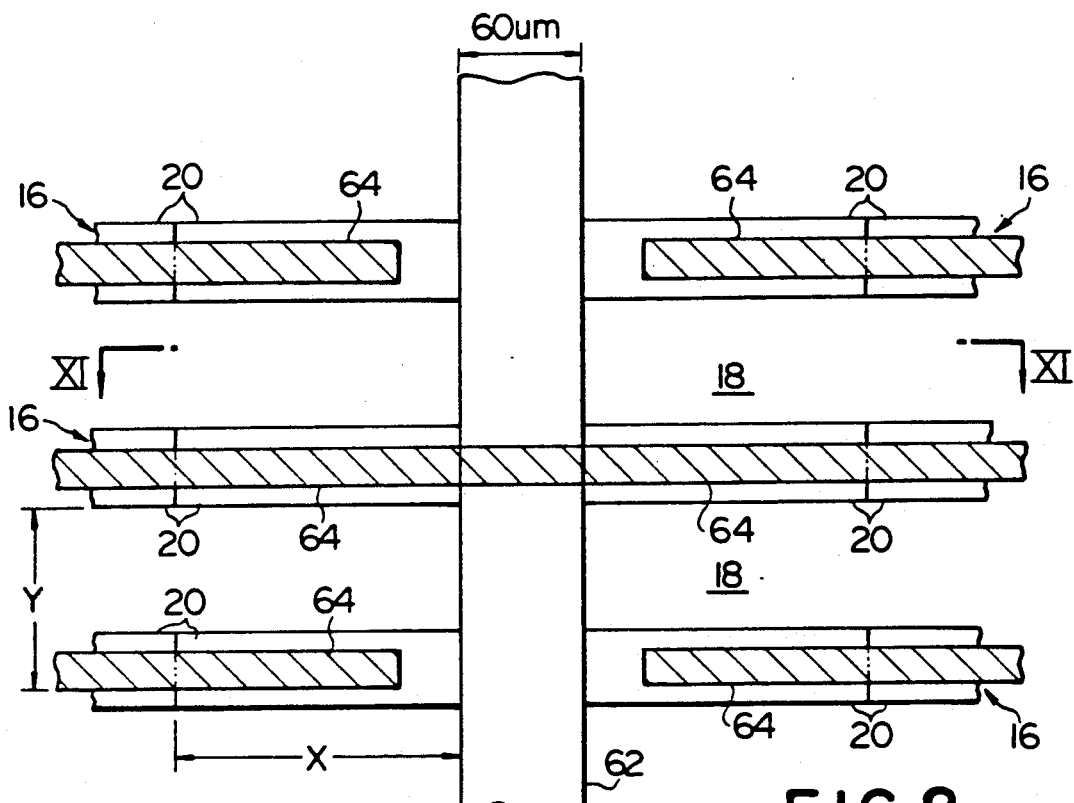
FIG. 8 is a fragmentary plan view showing, to an enlarged scale, a portion of the gate array shown enclosed by circle VIII in FIG. 7.

On the semiconductor large-scale integrated circuit chip 60 shown in FIG. 7 are further provided a plurality of logic building blocks 16 arranged in parallel rows between one pair of parallel bonding-pad areas 12 of the chip 60 and spaced apart from each other to form parallel wiring channels 18 between the individual blocks 16. Each row of logic building blocks 16 consists of elementary cells 20 arranged in series between the other pair of parallel bonding-pad areas 12 as partly shown to an enlarged scale in FIG. 8. The elementary cells 20 are connected together through interconnection lines extending underneath the elementary cells 20 and in the wiring channels 18, though not shown in the drawings.

In the semiconductor large-scale integrated circuit chip 60, there are further provided main power supply lines implemented by conductor strips 62 extending between the metal bumps 44a and 44a'; 44b and 44b'; 44c and 44c'; 44d and 44d'; and 44e and 44e'. The main power supply conductor strips 62 extending between the metal bumps 44a and 44a'; 44c and 44c'; and 44e and 44e' provide main high-level power supply lines in the large-scale integrated circuit chip 60 and the main power supply conductor strips 62 extending between the metal bumps 44b and 44b'; and 44d and 44d' provide main low-level power supply lines in the chip 60.

The main power supply conductor strips 62 thus connecting the pairs of metal bumps 44a to 44e and 44a' to 44e' extend perpendicularly to the logic building blocks 16 and are bonded to local power distribution lines 64 implemented by thick-layer wiring strips forming a layer underlying the layer of the main power supply conductor strips 62. These local power distribution lines 64 are preferably formed concurrently with the formation of the metal bumps 44a to 44e and 44a' to 44e' on the semiconductor chip 60. The main power supply conductor strips 62 are thermocompression bonded to these local power distribution lines 64 and to the metal bumps 44a to 44e and 44a' to 44e' during the semiconductor wafer processing operation to fabricate the emitter-coupled logic gate array on the chip 60. Each of the logic building blocks 16 is composed of a row of three elementary cells 20 located between adjacent two of the main power supply conductor strips 64. It may be herein noted that there are no elementary cells 20 located below the main power supply conductor strips 62 so that the elementary cells 20 provided on the chip 60 are free from the mechanical stresses that will be created when the main power supply conductor strips 62 are bonded to the local power distribution lines 64 during wire bonding processing.

Each of the local power distribution lines 64 thus branched perpendicularly from the main power supply conductor strips 62 extends on and along one of the logic building blocks 16 and is electrically connected to selected ones of the elementary cells 20 of the logic building block 16 along which the local power distribution line 64 extends. The local power distribution lines 64 are thus electrically connected through the main power supply conductor strips 62 to the pairs of metal bumps 44a to 44e and 44a' to 44e'. In this instance, the local power distribution lines 64 connected through the main power supply conductor strips 62 to the alternate pairs of metal bumps 44a and 44a'; 44c and 44c' and 44e and 44e' are used as high-level power distribution lines and the local power distribution lines 64 connected through the conductor strips 62 to the alternative pairs of leads 44b and 44b' and 44d and 44d' are used as low-level power distribution lines. The local power distribution line 64 which extends on each of the logic building blocks 16 is thus used either as the high-level power distribution line or as the low-level power distribution line. Between two adjacent main power supply lines 44/50 is provided a column of high-level and low-level power distribution lines 64 which extend alternately from the high-level and low-level power supply main power supply conductor strips 62. Thus, the high-level and low-level power distribution lines 64 appear alternately on the logic building blocks 16 extending between the high-level power supply main conductor strip 62 intervening between the pair of high-level power supply metal bumps 44a and 44a', 44c and 44c' or 44e and 44e' and the low-level power supply conductor strip 62 intervening between the pair of low-level power supply leads 44b and 44b' or 44d and 44d'. It may be noted that the low-level power distribution lines for the logic building blocks 16 having the overlying high-level power distribution lines 64 and the high-level power distribution lines for the logic building blocks 16 having the overlying low-level power distribution lines 64 lines are formed by another inter-level layer (not shown) underlying the inter-level layer forming the local power distribution lines 64 herein shown.

It may be further noted that the conductor strips forming the local power distribution lines 64 herein shown extend along and overlies the respectively associated ones of the logic building blocks 16 and are not located on the parallel wiring channels 18 between the individual logic building blocks 16. In the absence of the local power distribution lines 64 on the wiring channels 18, there are no parasitic capacitances added to the interconnection lines extending in the wiring channels 18, as in the embodiment described with reference to FIGS. 4 to 6.

The main power supply conductor strips 62 may be bonded to the metal bumps 44a to 44e and 44a' to 44e' and the local power distribution lines 64 with use of a lead carrier similar to that used in the tape automated bonding process. In this instance, the lead carrier may be removed from the chip 60 on completion of the thermocompression bonding of the main power supply conductor strips 62 but this is not an essential requirement in fabricating a conductor strip according to the second preferred embodiment of the present invention. It may be noted that the lead carrier to be used in this thermocompression bonding process is fabricated separately of the semiconductor wafer processing steps and has apertures where the conductor strips 62 are to be bonded to the bumps and local power distribution lines.

Figure 9:
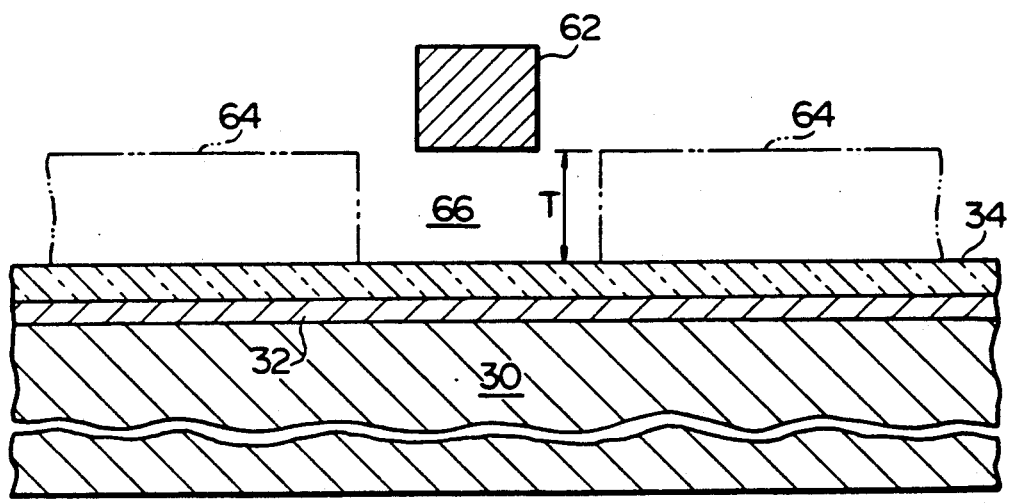
FIG. 9 is a sectional view taken along line IX—IX in FIG. 8.

FIG. 9 shows a cross sectional configuration of a portion of the large-scale integrated circuit chip 60 taken along line IX—IX in FIG. 7. The large-scale integrated circuit chip 60 is shown comprising a semiconductor substrate 30, an inter-level conductor layer 32 forming interconnections for the elementary cells 20, and an insulator layer 34 of, typically, silicon dioxide. The main power supply conductor strips 62 bridge the local power distribution lines 64 which are herein shown by phantom lines and thus extend over the insulator layer 34 so that there is formed a layer of air 66 between each of the conductor strips 62 and the insulator layer 34. The metal bumps 44 are herein assumed to be formed to a thickness of 20 microns and, accordingly, the layer of air 66 formed between the insulator layer 34 and the main power supply conductor strips 62 has a thickness (T) of 20 microns which is assumed to be the thickness of the local power distribution lines 64 which are formed concurrently with the formation of the metal bumps 44a to 44e and 44a' to 44e'. The semiconductor substrate 30 is formed typically by a laminar structure comprising a base layer of silicon and layers of insulator and diffusion selectively deposited thereon.

The interconnection lines formed by the inter-level conductor layer 32 are directed in crossing relationship to the main power supply conductor strips 62 and are assumed to measure 3 microns in width. The insulator layer 34 of silicon dioxide overlying this inter-level conductor layer 32 is formed to a thickness of 2 microns and is assumed to have a relative permittivity of 4. Each of the main power supply conductor strips 62 is assumed to have a width of 60 microns, a thickness of 60 microns and a resistivity of 0.005 ohm/square.

It is further assumed that the design rules of the large-scale integrated circuit chip 60 herein shown are also such that each of the elementary cells 20 has a length X of 150 microns and a pitch Y of 100 microns. It is further assumed that there are a total of 60 rows of logic building blocks 16 on the semiconductor chip 60 although only 13 rows of logic building blocks are shown in FIG. 7 for simplicity of illustration and that a current of 10 mA is to be applied to each of the elementary cells 20.

Thus, each of the main power supply conductor strips 62 such as for example, the high-level main power supply conductor strip 62 extending between the metal bumps 44c and 44c' is required to supply current to a total of ninety (=3×2×60/4) elementary cells 20 located between the end point (indicated by sign "*" in FIG. 7) and the center point (indicated by sign "+" in FIG. 7) of the cell area of the chip 60. In this instance, the voltage drop _V in the length of main power supply conductor strip 62 extending over these ninety elementary cells 20 is approximately 12 mV. This value of the voltage drop _V is higher than that of the voltage drop _V caused in the first preferred embodiment of the present invention, the increase in the voltage drop having resulted from the absence of the thick-layer wiring strips between the insulator layer 34 and the main power supply conductor strips 62. In view, however, of the fact that the local power distribution lines 64 are formed by thick-layer wiring strips, the voltage drop _V of 12 mV through the main power supply conductor strip 62 is acceptable for practical purposes.

In the arrangement shown in FIG. 7, the parasitic capacitance $C_p$ between one of the interconnection lines forming the inter-level conductor layer 32 and the high-level main power supply conductor strip 62 crossing the interconnection line is given as:

$$C_p = 1/(1/C_s + 1/C_a) \quad \text{Eq. 6}$$

where $C_s$ is the capacitance resulting from the insulator layer 34 and $C_a$ is the capacitance resulting from the layer of air 66. Each of the main power supply conductor strips 62 measuring 60 microns in width as above noted, the parasitic capacitance $C_s$ resulting from the insulator layer 34 is calculated, when the layer 32 and the layer forming the conductor strip 62 are regarded as the parallel plates of a capacitor, as:

$$C_s = (60 \ \mu m \times 3 \ \mu m)/2 \ \mu m \times 4 \times \epsilon_0 = 3.187 \times 10^{-3} pF \quad \text{Eq. 7}$$

The capacitance $C_a$ resulting from the layer of air 66 is calculated as $$C_a = (60 \ \mu m \times 3 \ \mu m)/20 \ \mu m \times 1 \times \epsilon_0 = 7.969 \times 10^{-5} pF \quad \text{Eq. 8}$$

The parasitic capacitance $C_p$ is thus given as $$\begin{aligned} C_p &= 1/\{1/(3.187 \times 10^{-3}) + 1/(7.969 \times 10^{-5})\} \\ &= 7.77 \times 10^{-5} \ pF \end{aligned} \quad \text{Eq. 9}$$

Considering that the main power supply conductor strip 62 under consideration is associated with three elementary cells 20 each having the length (X) of 150 microns and per se has a width of 60 microns, the total parasitic capacitance $C_T$ between the inter-level conductor layer 32 formed by a unit length 1 mm (=1000 μm) of the interconnection line under consideration and the main power supply conductor strip 62 crossing the interconnection line is given as:

$$C_T = 1000 \ \mu m/(150 \ \mu m \times 3 + 60 \ \mu m) \times (7.77 \times 10^{-5} pF) \simeq 0.00015 \ pF \quad \text{Eq. 10}$$

It will be understood that the capacitance value of the order given by this Eq. 10 approximately equals 0.4 per cent of the value of 0.035 pF given by Eq. 3, offering 99.6 per cent of improvement over the described prior-art semiconductor integrated circuit.

Actually associated with an interconnection line included in the interlevel conductor layer 32 are not only the parasitic capacitance formed between the interconnection line and the main power supply conductor strip 62 crossing the line 62 but the capacitance formed between the particular interconnection line and each of the overlying and underlying interconnection lines extending in crossing relationship to the former. In the wiring arrangement of a prior-art large-scale integrated circuit chip, the former parasitic capacitance is far larger than the latter and, in addition, increasing the integration density of a large-scale integrated circuit chip may make it difficult to provide the wiring channels between the logic building blocks on the large-scale integrated circuit chip.

In the second preferred embodiment of the present invention, the parasitic capacitance formed between the interconnection line and the main power supply line 62 is reduced to approximately 4 per cent of that in the prior-art semiconductor integrated circuit as has been noted and practically can be disregarded at least in respect of the inter-level conductor layer closest to the layer of the power supply lines.

As will have been understood from the foregoing description, a semiconductor integrated circuit according to the present invention is characterized inter alia by the power supply wiring arrangement in which conductor strips fabricated by a process independent of the wafer processing operation to fabricate a large-scale integrated circuit on a semiconductor chip are bonded to the metal bumps and thick-layer wiring strips formed on the chip during the wafer processing operation. By virtue of this power supply wiring arrangement, the resistances in the power supply lines to the individual elementary cells on the large-scale integrated circuit chip can be reduced significantly with consequent reduction in the voltage drops in a high-density, large-current integrated circuit and accordingly in the parasitic capacitances associated with the interconnection lines in the inter-level conductor layer. A semiconductor integrated circuit according to the present invention is further advantageous in that the number of the main power supply lines can also be reduced significantly so that there can be provided ample spaces for the wiring channels to accommodate an increased number of interconnection lines in a large-scale integrated circuit chip having an increased integration density.

It may also be added that, because of the significant reduction in the voltage drops in the supply power and in the parasitic capacitance associated with the interconnection lines in an inter-level conductor layer, a large-scale integrated circuit chip carrying a semiconductor integrated circuit according to the present invention provides a sufficient range of noise margin and permits formation of an internal circuits having an increased ability to activate loads on the chip with a current of the order used in a high-speed large-scale integrated circuit chip typically forming an emitter-coupled logic gate circuit.

What is claimed is:

1. A semiconductor integrated circuit formed on a semiconductor chip, comprising:
   a) a plurality of logic building blocks formed substantially in parallel with each other on said semiconductor chip and each including a plurality of elementary cells,
   b) a plurality of pairs of metal bumps formed on the semiconductor chip,
   c) external power supply leads of metal and respectively formed on said pairs of metal bumps,
   d) a plurality of thick-layer wiring strips each extending in parallel to a direction substantially perpendicular to said logic building blocks between the bumps forming each of said pairs of metal bumps, said thick-layer wiring strips being substantially identical in material and in thickness to said metal bumps,
   e) main power conductor strips of metal respectively formed on said thick-layer wiring strips and extending between the external power supply leads on the bumps forming each of said pairs of metal bumps, and
   f) local power distribution lines electrically connected to said thick-layer wiring strips, each of the local power distribution lines extending along one of said logic building blocks and electrically connected to selected ones of the elementary cells of the particular one of said logic building blocks.

2. A semiconductor integrated circuit as set forth in claim 1, in which each of said local power distribution lines comprises a conductor strip directly branched from and integral with one of said thick-layer wiring strips.

3. A semiconductor integrated circuit as set forth in claim 1, further comprising
   g) inter-level conductor strips respectively underlying and electrically connected to said thick-layer wiring strips,
   h) each of said local power distribution lines comprising a conductor strip directly branched from one of said inter-level conductor strips.

4. A semiconductor integrated circuit formed on a semiconductor chip, comprising:
   a) a plurality of logic building blocks formed substantially in parallel with each other on said semiconductor chip and each including a plurality of elementary cells covered with an insulating film,
   b) a plurality of pairs of metal bumps formed on the semiconductor chip,
   c) main power supply conductor strips of metal each extending in parallel to a direction substantially perpendicular to said logic building blocks between the bumps forming each of said pairs of metal bumps, and
   d) local power distribution lines electrically connected to said main power supply conductor strips, said main power supply conductor strips being held in contact with upper surfaces of said local power distribution lines and spaced from said insulating film, each of the local power distribution lines extending along one of said logic building blocks and electrically connected to selected ones of the elementary cells of the particular one of the logic building blocks, each of said local power distribution lines being formed by a thick-layer wiring strip which is substantially identical in material and in thickness to said metal bumps.

5. A semiconductor integrated circuit as set forth in claim 4, in which the thick-layer wiring strip forming each of said local power distribution lines is directly branched from and integral with one of said main power supply conductor strips.

* * * * *